United States Patent
Wijeratne

(10) Patent No.: US 6,922,082 B2
(45) Date of Patent: Jul. 26, 2005

(54) SELECT LOGIC FOR LOW VOLTAGE SWING CIRCUITS

(75) Inventor: Sapumal Wijeratne, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/676,345

(22) Filed: Sep. 30, 2003

(65) Prior Publication Data

US 2005/0068065 A1 Mar. 31, 2005

(51) Int. Cl.$^7$ .......................................... H03K 19/094
(52) U.S. Cl. ......................... 326/105; 326/98; 326/93; 327/202; 327/203
(58) Field of Search ........................... 326/105, 93, 95, 326/98; 327/201–203, 210, 211, 218, 100–103, 108

(56) References Cited

U.S. PATENT DOCUMENTS

| | | | | |
|---|---|---|---|---|
| 5,194,765 A | * | 3/1993 | Dunlop et al. ................ | 326/87 |
| 5,850,157 A | * | 12/1998 | Zhu et al. .................... | 327/295 |
| 5,986,473 A | | 11/1999 | Krishnamurthy et al. | |
| 6,204,698 B1 | | 3/2001 | Zhang | |
| 6,255,861 B1 | | 7/2001 | Zhang | |
| 6,323,698 B1 | * | 11/2001 | Fletcher ....................... | 327/100 |
| 6,329,859 B1 | * | 12/2001 | Wu ............................ | 327/291 |
| 6,442,089 B1 | | 8/2002 | Fletcher et al. | |
| 6,448,818 B1 | * | 9/2002 | Fletcher ....................... | 326/119 |

* cited by examiner

*Primary Examiner*—Vibol Tan
(74) *Attorney, Agent, or Firm*—Schwabe, Williamson & Wyatt, P.C.

(57) ABSTRACT

An apparatus comprising a low voltage swing (LVS) circuit having a plurality of alternating LVS pre-charging and evaluation phases and a select logic circuit coupled to the LVS circuit and responsive to a plurality of input data signals to generate a plurality of select signals for the LVS circuit. Each of the select signals occurs during one of the LVS evaluation phases and has a turning-on edge and a turning-off edge. The turning-off edge of each of the select signals is generated independent of the input data signals.

30 Claims, 7 Drawing Sheets

SELECT LOGIC FOR LOW VOLTAGE SWING CIRCUITS

BACKGROUND OF THE INVENTION

1. Field of the Invention

The present invention relates to electronic devices, and in particular, to select signal circuits for low voltage swing circuits.

2. Description of Related Art

Low-voltage-swing (LVS) circuits have been developed as a means to decrease circuit area, increase throughput and consume less power than other circuit families. LVS circuits utilize large networks of pre-charged dual rail gates with low voltage outputs and sense amplifiers to restore the output to full rail signals. In contrast to full-voltage swing circuits, a low-voltage-swing logic circuit may provide valid data output signals based on a relatively small difference in potential between a pair of complementary data input signals. More specifically, a first data wire is used to carry a true value of the valid data signal and a second data wire is used to carry a complementary value of the same valid data signal. In a two-phase clocking arrangement, during a first clocking or pre-charging phase, both the data wires are pre-charged to a predetermined or pre-charge potential. At this point, the data wires do not contain any valid data or information. During a second clocking or evaluating phase, the potentials on the two wires may diverge in response to the information content of an input data signal. In particular, one data wire "evaluates" by transitioning toward an evaluation potential and the second data wire remains at the pre-charge potential, the low-voltage-swing logic arrangement then provides a valid data output signal based on the potential or voltage difference between the valid true and complementary data input signals. After the second clocking or evaluating phase, both data wires are again pre-charged to their pre-charge potential during a succeeding first clocking or pre-charge phase.

With respect to inputs to precharged-low LVS circuits, many circuit branches may drive the same LVS node. In these topologies the select logic of the LVS circuit is such that during LVS evaluation phase, only one of these branches will drive the LVS node. Even though logically only one branch can be selected, it is possible that a branch selected during the previous cycle's evaluation phase is still turning OFF when the LVS circuit enters the current evaluation phase. This phenomenon can create potential differential in the direction opposite to the proper logical value. In such a case, this phenomenon slows down the operation of the LVS circuit. The reason for this is that the reverse differential (differential noise) must first be overcome before a differential can be built up in the correct direction. If a pulsed clock system is used to clock the LVS circuit and the contention period is significant, then the LVS circuit may not be able to overcome the reverse differential and a functional failure of an integrated circuit (e.g. a microprocessor) containing the LVS circuit may occur.

Reverse differential build-up can be avoided by using precharged-low dynamic selects as an input to the LVS circuit. In this case the domino logic providing the dynamic selects needs to be in phase with the LVS circuit. However, a dynamic select is not a viable solution if the LVS circuit is distributed over a large distance, because in this case the LVS select maximum and minimum timing window is non-existent (negative) for sufficiently fast target frequencies. Furthermore, a dynamic signal distributed across a long distance is susceptible to pulse evaporation if the clock period is sufficiently short (high target frequency). Therefore, the use of static selects signals to enable a distributed LVS circuit is sometimes unavoidable.

FIG. 1 illustrates the current state of the art for generating static LVS select signals for an illustrative LVS circuit 10, while minimizing or eliminating reverse differential build-up in the LVS circuit 10. A generic, master-slave flip-flop 12 drives the select signals with a minimum number of stages to the LVS circuit 10. The LVS circuit 10 may be a distributed structure; therefore, the LVS select signal may have to span a long distance. The illustrative LVS circuit 10, in this case, is shown as a 3:1 multiplexer circuit. The driving flip-flop 12 is triggered a phase ahead of the evaluation phase of the LVS circuit 10. In this example the select signals SA, SB, and SC are applied to the LVS circuit 10. These select signals are mutually exclusive signals and therefore logically only one of the three signals will be HIGH during the evaluation phase of the LVS circuit 10. The rising of the flip-flop clock signal (CLOCK1) triggers the flip-flop 12 and the select signal that was HIGH in the previous cycle transitions from HIGH to LOW, while another select signal for the current evaluation period transitions from LOW to HIGH. Ensuring that the turning-OFF edge of the previous select signal occurs before the LVS circuit 10 begins its next evaluation eliminates reverse differential build-up in the LVS circuit 10. In order to speedup the data-dependant turning-OFF edge, the number of buffer stages 16 between the flip-flop 12 and LVS circuit 10 has been minimized to one.

The prior art circuit arrangement of FIG. 1 illustrates the best-known method to eliminate reverse differential build-up, which is to speed up the turning-OFF edge of the select signals such that the LVS branch that is ON from the previous evaluation cycle is OFF before the next LVS evaluation phase begins. This is achieved by: (A) minimizing the number of buffer stages between the master-slave flip-flop 12 driving the select signals and the LVS circuit 10; (B) skewing the buffer stages 16 between the flip-flop 12 and the LVS circuit 10 such that the turning OFF edge is sped up at the expense of the turning ON edge; and (C) speeding up the clock signal to the flip-flop 12 such that the flip-flop 12 is triggered earlier in order to speedup the arrival times of the select signal's de-assertion and assertion edges at the gate inputs of the LVS circuit 10.

The master-slave flip-flop 12 includes a master and a slave latch, with each having an open and a close state. The latches pass through the data when in the open state and hold (latch) the data when in the close state. When the master latch in the close state is holding the data acquired from the previous clock phase, the slave latch in the open state is passing the data being held by the master latch through to the flip-flop's output. When the clock phase is reversed, the master latch switches to its open state to acquire new data and at the same time the slave latch switches from its open state of acquiring the master latch's output data to its close state of holding the previous-provided data. Hence, the master and slave latches operate "out-of-phase".

DETAILED DESCRIPTION OF AN ILLUSTRATIVE EMBODIMENT

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 2:
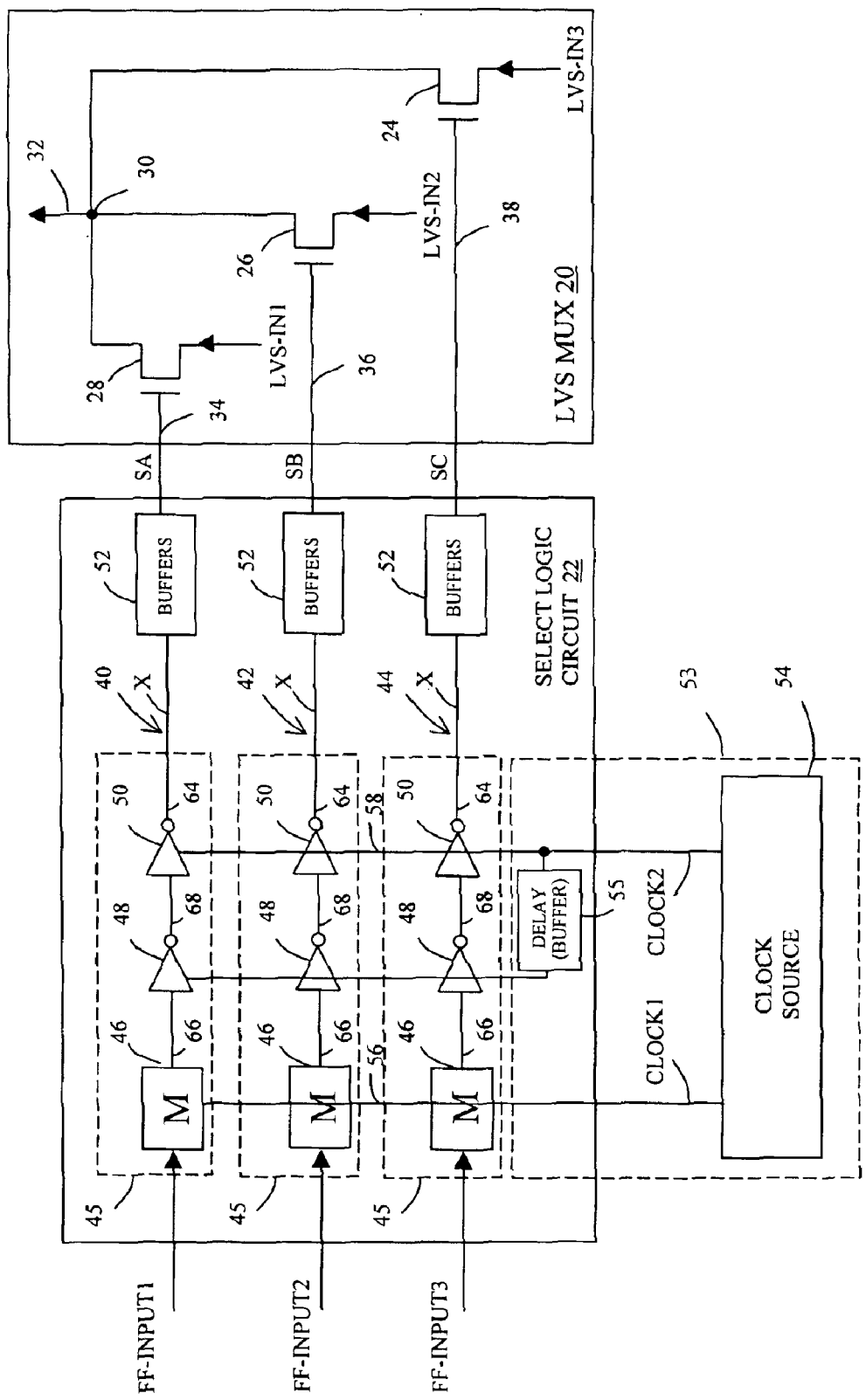
FIG. 2 illustrates a select logic circuit for a LVS circuit in accordance with one embodiment of the present invention.

With reference to FIG. 2, there is shown an illustrative low voltage swing (LVS) circuit 20 with a select logic circuit 22 in accordance to one embodiment of the present invention. Although many possible LVS circuits may be used with this select logic circuit 22, the illustrative LVS circuit 20 is a 3:1 multiplexer having three n-channel (NFET) transistors 24, 26, and 28 with their source terminals coupled to input signals LCS-IN1, LCS-IN2, and LCS-IN3 respectively and with their drain terminals coupled to a common node 30, so as to provide a single output signal on line 32. The transistors 24, 26 and 28 have three input gate terminals 34, 36 and 38, respectively, which define three input terminals for the LVS circuit 20. However, depending on the LVS circuit used with the select logic circuit 22, any number of input terminals is possible. As with all LVS circuits, the LVS circuit 20 utilizes pre-charged dual rail gates with low voltage outputs and sense amplifiers (not depicted) to restore the output to full rail signals.

Although any number of inputs is possible, in the embodiment of the select logic circuit 22 of FIG. 2 there arc three input signals: FF-INPUT1, FF-INPUT2, and FF-INPUT3 correlating with the three inputs 34, 36 and 38 of the LVS circuit 20. Hence, the select logic circuit 22 includes three circuit branches 40, 42, and 44. Each of the branches has the same components; hence, they are given the same reference numbers. Each branch 40, 42 and 44 includes a flip-flop 45 having in series a master latch 46, a D1 domino 48, a slave latch 50, and even number of buffering inverters 52 (at least one pair). Each master latch 46 has an input to receive one of the input signals FF-INPUT1–3 and each pair of buffering inverters 52 has an output coupled to one of the inputs 34, 36, 38 of the LVS circuit 20. The output signals of the flip-flops 45 on are designated as select signals "x". The D1-domino 48 takes the form of a D1-domino inverter and the slave latch 50 takes the form of a Set Dominant Latch (SDL) and, in particular, a SDL inverter. Although the D1-domino is shown as an inverter, other D1 domino circuits may be used. An even number (at least two) of buffering inverters 52 are coupled between the slave latch 50 and the input gates of the LVS circuit 20.

A clock generator 53 includes a clock source 54 and a delay buffer 55. In a first implementation of the clock generator 53, the clock source 54 provides a first clock pulse signal (CLOCK1) to the three master latches 46 via a conductor 56 (also referred to as the "master clock signal") and a second clock pulse signal (CLOCK2) to all three slave latches 50 via a conductor 58 (also referred to as a "slave clock signal"). The first and second clock pulse signals have the same frequency. The second clock signal is passed through a delay buffer 55 to provide a delayed second clock signal to the three D1-dominos 48 (also referred to as the "domino clock signal"). In a first application of the select logic circuit 22, no delay is introduced between the slave and domino clock signals, i.e., no delay is introduced by the delay buffer 55 (therefore buffer 55 is not needed). In a second application of the select logic circuit 22, the second clock signal CLOCK2 is sped up (therefore, the slave clock is sped up) and a clock delay is introduced into the second clock signal by the delay buffer 55 so that the domino clock remains unchanged from the first application. This delay allows for the slave latch 50 to be clocked earlier than the D1-domino 48, which in turn allows for a higher target frequency as will be explained hereinafter. These two applications of the select logic circuit 22 are described in detail with respect to FIGS. 6 and 7. The delay buffer 55 includes an even number of inverters to delay the second clock signal. The use of the first and second clock signals CLOCK1 and CLOCK2 provides the most freedom in clock timing. However, as described below, only a single clock signal may be used.

In a second implementation of the clock generator 53, a single, common clock signal is generated by the clock generator 53. This common clock signal is directly connected to the slave latches 50 and, after a delay introduced by the delay buffer 55 (again, an even number of inverters), is commonly connected to the master latches 46 (not depicted in FIG. 2) and the D1-dominos 48. With respect to the second described application of the select logic circuit 22 (buffer delay), this clock generator implementation allows for the option of resetting the slave latches 50 earlier with respect to the master latches 46 and the D1-dominos 48, but with a single clock signal. In other words, the common clock signal becomes the slave clock signal and thereafter the buffer delay of the delay buffer 55 is introduced to generate the master clock signal and the domino clock signal. With respect to the above-described first application of the select logic circuit 22 (no buffer delay), an extension of this second implementation of the clock generator 53 is to have all three clock signals (master, domino, and slave) consist of the same common clock signal (same frequency and phase shift). In all the variations described above, all the clock signals have the same frequency.

Figure 3:
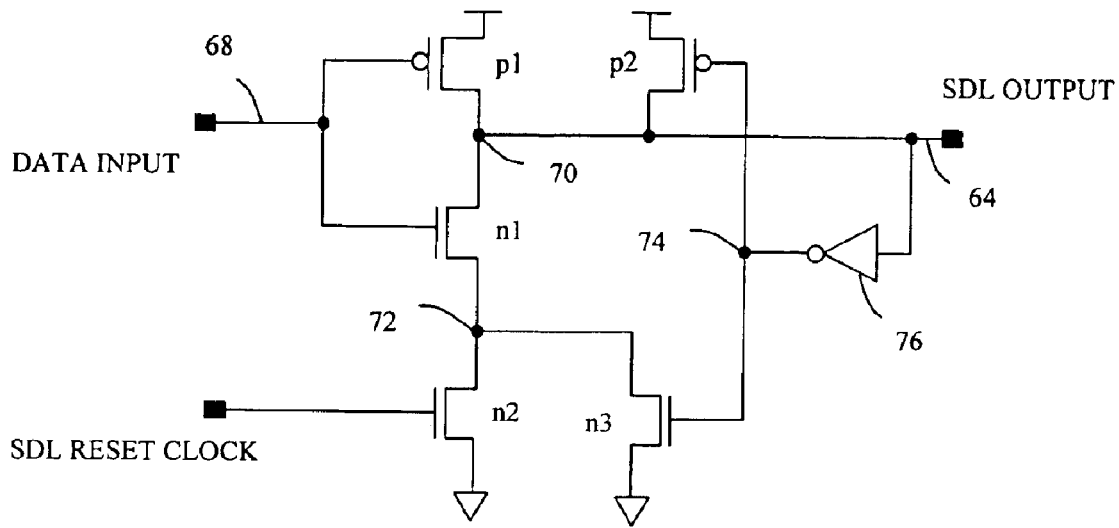
FIG. 3 is a schematic of one embodiment of the slave latch shown in FIG. 2.

FIG. 3 illustrates the slave latch 50 of FIG. 2 in detail. A leg of transistors includes a first p-channel transistor P1 with a source terminal coupled to the supply voltage $V_{CCT}$ and a drain terminal coupled to a node 70, a first n-channel transition N1 with a source terminal coupled to the node 70 and a drain terminal coupled to a node 72, and a second n-channel transistor N2 with a source terminal coupled to the node 72 and a drain terminal coupled to ground. A second p-channel transistor P2 is coupled between the supply voltage and node 70 and a third n-channel transistor N3 is coupled between a node 74 and ground. An inverter 76 is coupled between node 70 and node 74 and node 74 is also connected to the gate of the second transistor P2. The input data (which is the output signal of the D1-domino 48) is provided over line 68 to gates of transistors P1 and N1. The second clock signal (slave clock signal) is a reset signal for the slave latch 50 and is coupled to a gate of the transistor N2. The output signal of the slave latch 50 at node 70 is provided over the line 64.

Figure 4:
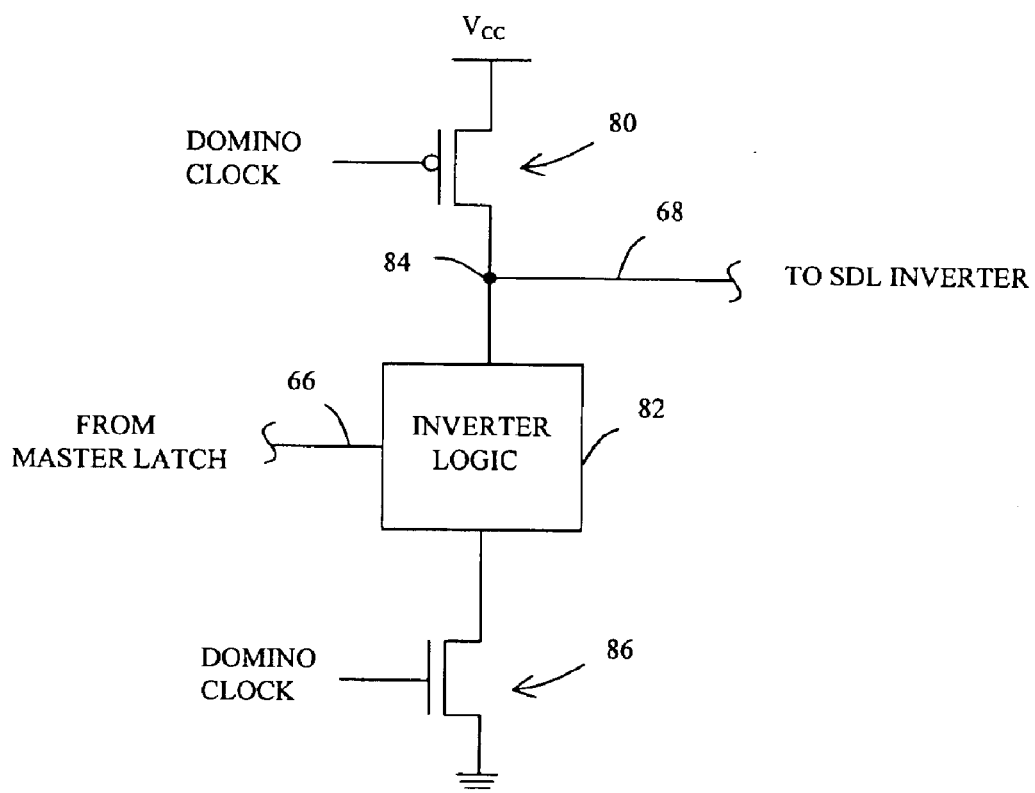
FIG. 4 is a schematic of one embodiment of the D1-domino shown in FIG. 2.

FIG. 4 illustrates the D1-domino 48 of FIG. 2 in detail. Each of the D1-dominos 48 is known in the art as a "D1 domino" and use domino logic. The D1-domino 48 consists of two main components: a pre-charge p-type field-effect device 80 having its gate coupled to the domino clock (delayed second clock signal), and a conditional pull-down n-type device stack (the inverter logic) 82 that evaluates the latch output signal of the master latch 46 provided via a line 66. The p-type pull-up device 80 is coupled between the positive supply, Vcc and an output node 84, with the node 84 also being coupled to the input of the slave latch 50 via a line 68. The n-channel device stack 82 is coupled in series with clocked n-type transistor 86 between node 84 and ground. As mentioned above, the device stack 82, which in this case is inverter logic (n-type field-effect devices not shown), is utilized to evaluate the input logic signal via line 66. Operation of the traditional D1-domino 48 is relatively simple. When the domino signal coupled to the gates of the devices 80 and 86 is low, the circuitry is in a pre-charge phase. Domino output node 84 is pre-charged to a high potential during this pre-charge phase. The signal level of input to the n-channel device stack 82 is unimportant during the pre-charge phase, since the n-type devices of the inverter logic 82 coupled between the output node 84 and ground are nonconducting, i.e., "off". When the domino clock signal transitions high, the domino output node 84 is no longer actively driven by the p-type field-effect pull-up device 80. In the case, where the input satisfies certain logic conditions of the inverter logic 82, the output node 84 is discharged. Thus, when the domino clock signal is high, the domino circuit 48 is in an evaluation phase and when the clock is low, the D1-domino 48 is in its pre-charge phase.

Referring back to FIG. 2, each of the select signals SA, SB, SC is defined to have a "turning-ON edge" (asserting edge) and a "turning-OFF edge" (de-asserting edge). In the illustrative embodiment of FIG. 2, the turning-ON edge is a rising signal transition from low-to-high and the turning-OFF edge is a falling signal transition from high-to-low. When the select signals are high they are "ON" and when low they are "OFF". The turning-ON and turning-OFF edges of the select signals are described as having "arrival times" at the gates 24, 26, and 28 of the LVS circuit 20. The select logic circuit 22 is designed to speed up the arrival of the turning-OFF edge of a given select signal to substantially eliminate any possible contention with the turning-ON edge of the next select signal and therefore to substantially eliminate any reverse differential build-up. In other words, the select logic circuit 22 is designed to increase the difference in the arrival time of the turning-OFF edge of the given select signal and the arrival time of the turn-ON edge for the next select signal. This also may be characterized as reducing the difference in arrival times of the turning-ON and turning-OFF edges of the given select signal. The turning-ON edge and turning-OFF edge characterizations of select signals SA, SB, SC also describes the select signals "x".

Figure 1:
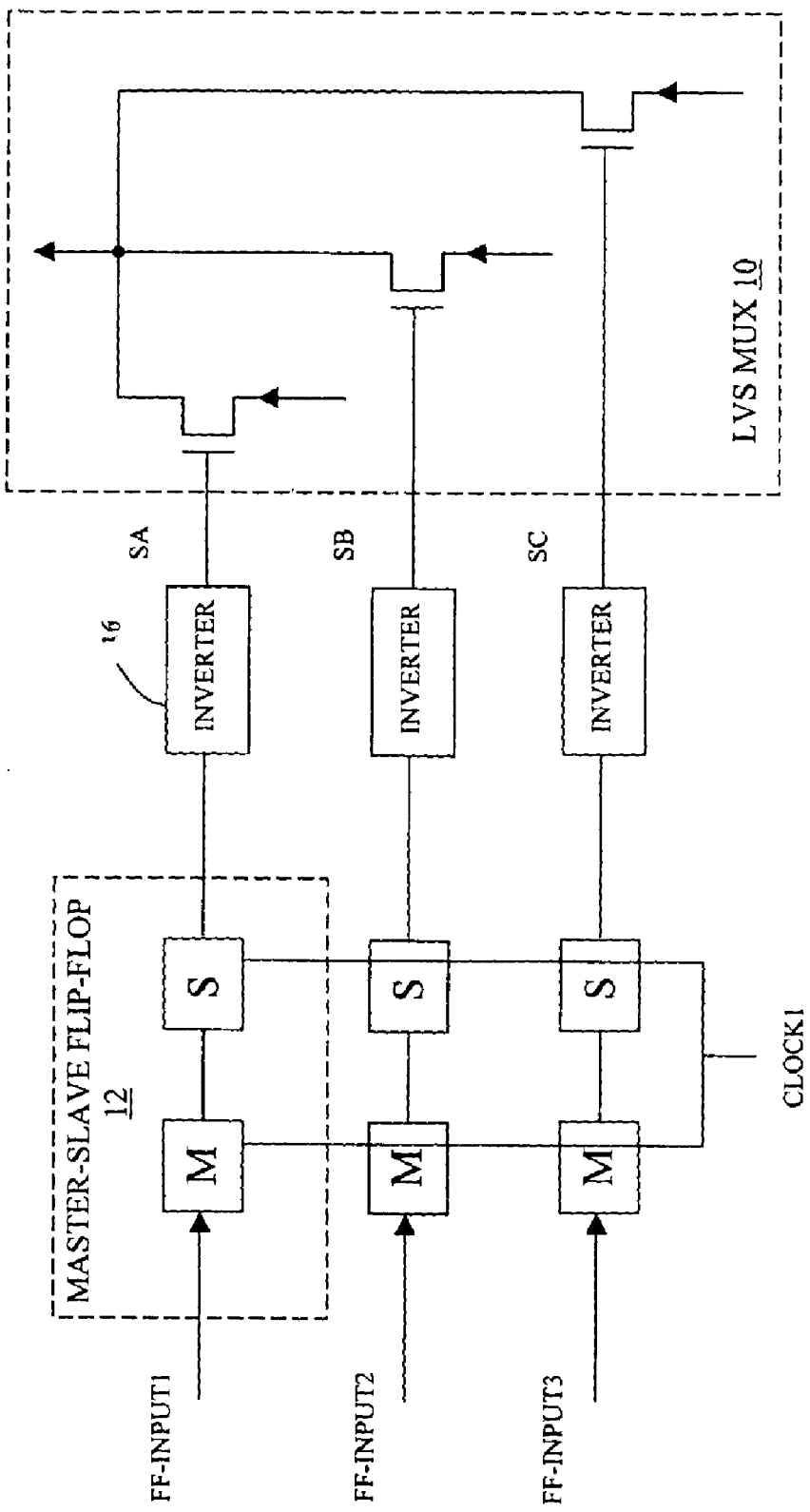
FIG. 1 shows a schematic of a prior art circuit arrangement for driving select signals to a LVS circuit.

As explained above, the embodiment of the present invention is designed to substantially eliminate reverse differential build-up by speeding up the turning-OFF edge of the select signals, such that the LVS branch 40, 42, or 44 which is ON from the previous LVS evaluation phase (cycle) is OFF before the next LVS evaluation phase begins. One factor in achieving the desired substantial elimination of reverse differential build-up is that the select logic circuit 22 enables the turning-OFF edge of the select signals to be generated independently of the input data. The operation of the select logic circuit 22 is described hereinafter to show how the turning-OFF edge of the select signals is generated independently of the input data. To accomplish this, the prior art slave latch of FIG. 1 is replaced in FIG. 2 with the D1-domino 48 followed by the slave latch 50. In other word, the D1-Domino 48 and the slave latch 50 in combination undertake the slave operation with respect to the master latch 46.

Figure 5:
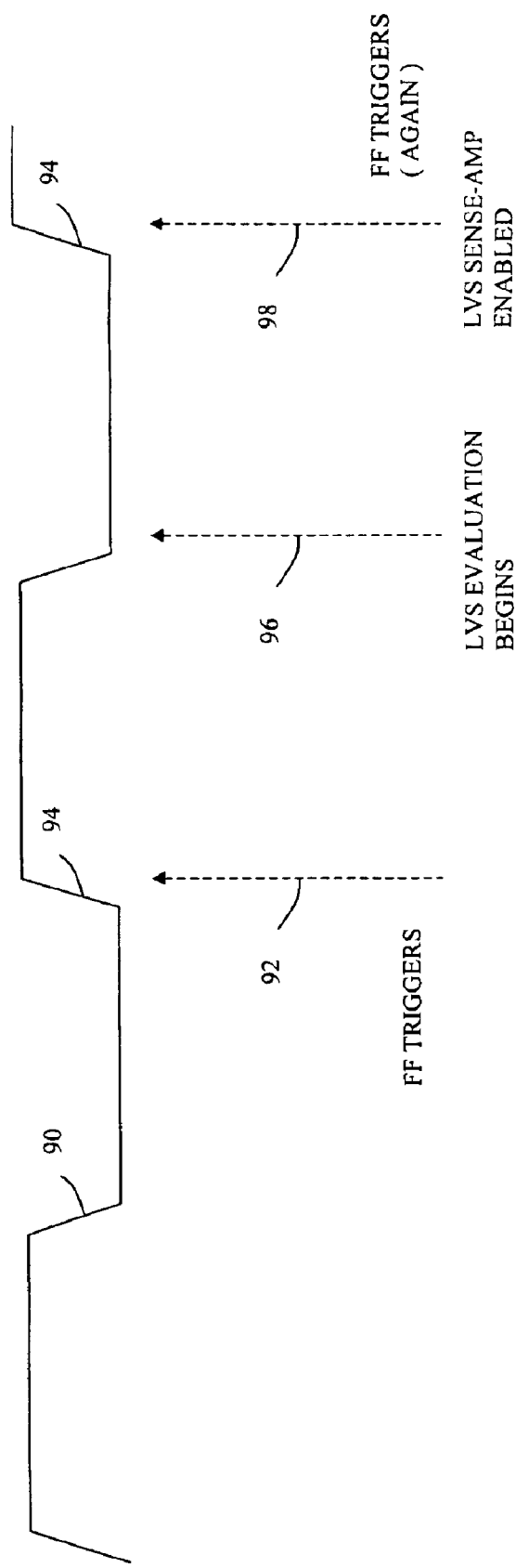
FIG. 5 is a timing diagram of a common clock signal generated by the clock generator shown in FIG. 2.

Referring to FIGS. 2 and 5, to assist in understanding the master-slave operation of the flip-flops 45, the circuits are defined as to whether they operate "in-phase" or "out-of-phase". In FIG. 2, the D1-domino 48 and the slave latch 50 operate in-phase with each other (with or without a delay or phase shift created by the delay buffer 55), but are out-of-phase with the preceding master latch 46. The master latch 46 and the slave latch 50 each have an open state and a close state. The latches 46 and 50 pass-through the data when open and hold (latch) the data when in the closed. The in-phase and out-of-phase relationships of the circuits of FIG. 2 are described in more detail with respect to an illustrative common clock signal 90 in FIG. 5. When the clock state is LOW, the master latch 46 is in its open state to acquire new data. Also, the D1-domino 48 is in its precharge phase (not receiving data from the master latch 46). The slave latch 50 is in its close state (not receiving data from the D1-domino 48), where it holds the previously-provided data from the D1-domino 48 and provides it as an output of the flip-flop 45 via the line 64 as select signals x. As designated by arrow 92, when the clock signal transitions from LOW to HIGH (the clock state is reversed), the flip-flop 45 is triggered. The master latch 46 switches from its open state to its closed state where it holds the new data it acquired in the previous clock phase when it was in its open state. Additionally, with the clock signal HIGH, the D1-domino 48 is in its evaluation phase and the slave latch 50 is reset and in its evaluation phase (its open state). During this evaluation phase, the D1-domino 48 and slave latch 50 acquire the output data of the master latch 46 and provide it as an output for the flip-flop 45. Hence, the D1 domino 48 and the slave latch 50 operate "in-phase" (with or without the delay of created by the delay buffer 55), whereas the master latch 46 and the slave latch 50 operate "out-of-phase". The exact timing of the master latch 46 is irrelevant. All that is needed to be known is that in the flip-flop 45, the master latch 46 and the slave latch 50 are "out-of-phase" and that the D1-domino must be "in-phase" with the slave latch 50 for correct functionality.

With respect to FIGS. 2 and 5, the low-to-high transitions of the clock signal 90 provides timing for the select signals SA, SB, and SC in that these transitions trigger the turning-OFF edges of the select signals. The LVS circuit 20 begins evaluation at the arrow 96 and the sense amplifiers (not depicted) of the LVS circuit 20 are enabled at the arrow 98 to sense the voltage differentials. Again, as with every low-to-high transition, the flip-flop 45 is triggered at the arrow 98. The previously mentioned first and second applications of the select logic circuit 22 now will be described with respect to FIGS. 6 and 7 respectively. In both applications, the turning-OFF edge of the select signals is generated independently of the input data, but instead are triggered by the slave clock resetting the slaves latches 50 in manner to be described hereinafter.

Referring to FIG. 2, in the first application of the select logic circuit 22, there is no buffer delay between the domino and slave clocks. In other words, the delay buffer 55 of FIG.

2 between D1-domino 48 and slave latch 50 is set to zero. The second clock signal CLOCK2 goes to both the slave latches 50 and the D1-dominos 48 without delay (i.e., a common clock). In this first application, the domino evaluation phase of the D1-domino 48 and the reset of the slave latch 50 are simultaneously triggered by the rising edge of the second clock signal (CLOCK2), which becomes a common clock signal for the two components. Within one gate delay of the rise of the clock signal CLOCK2, the output of the slave latch 50 falls and begins the turning-OFF edge transition of the ON select signal, because the D1-domino 48 has only just begun to evaluate and therefore the D1-domino 48 is still in the pre-charge phase with its output on line 68 still being in its pre-charge state. The turning-ON edge of the next select signal is generated at the output of the slave latch 50 two gate delays after the rise of the second clock signal CLOCK2, because it is the result of the domino evaluation traversing through the slave latch 50. As mentioned before, it requires only one gate delay to generate the turning-OFF edge of the previous select signal.

Figure 6:
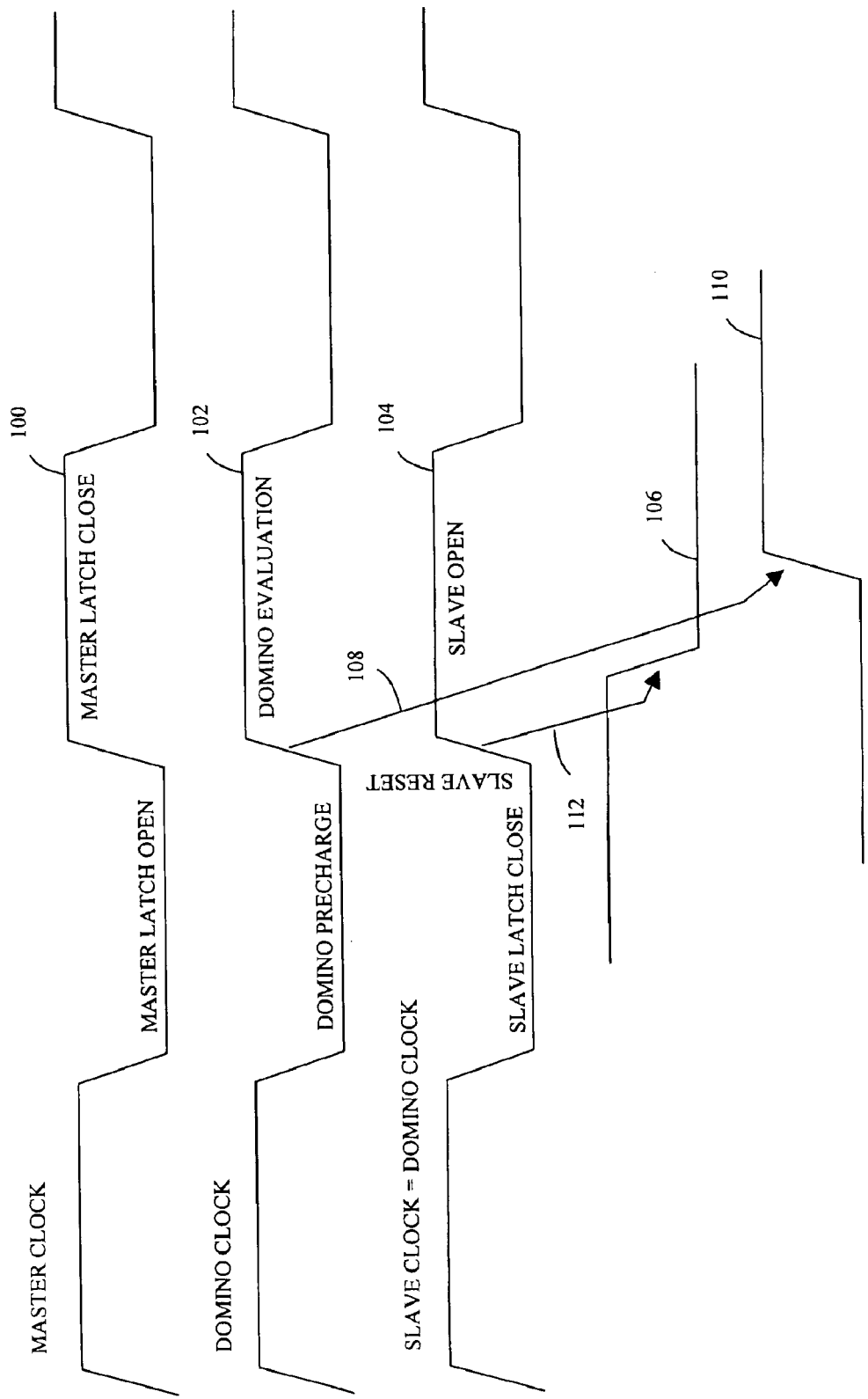
FIG. 6 is a timing diagram of a first application of the select logic circuit of FIG. 2 wherein a domino clock signal and a slave clock signal are the same.

Referring to FIGS. 2 and 6, the reset of the slave latch 50, and therefore the generation of the turning-OFF edge of the select signal, is independent of the data in the master latch 46, even with the delay of the buffer 55 being set to zero. This is best shown in FIG. 6, where there is illustrated a master clock waveform 100, a domino clock waveform 102, and a slave clock waveform 104. In this case, all three clock signals are the same, but the important aspect is that the domino clock waveform 102 and slave clock waveform 106 are the same (no clock delay introduced by the delay buffer 55). The master clock and the domino clock are fixed in timing. It is only the clock to the slave latch 50 that is variable. In other words, CLOCK2 is variable but the domino clock is not. If CLOCK2 is varied, then the timing of the buffer 55 must be set such that the domino clock timing has not changed, as occurs in the second application discussed below. In this illustrative case of the first application, CLOCK1 is equal to CLOCK2.

The different phases of the components described in FIG. 5 are also shown in FIG. 6. More specifically, with the master clock waveform 100, the master latch 46 is shown with the MASTER LATCH OPEN state and MASTER LATCH CLOSE state. With the domino clock waveform 102, the D1-domino 48 is shown with DOMINO PRE-CHARGE phase and DOMINO EVALUATION phase. With the slave clock waveform 104, the slave latch 50 is shown with the SLAVE LATCH CLOSE state and SLAVE LATCH OPEN state. When the domino clock signal 102 is LOW, then the D1-dominos 48 are in their pre-charge phase and therefore the inputs of the slave latches 50 are preset HIGH. When the slave clock 104 rises, the slave latches 50 begin to pull-down (SLAVE RESET) because the D1-dominos 48 are HIGH. If a given D1-domino 48 remains high in its evaluation phase, then the associated slave latch 50 receives a one inversion head start in generating a falling transition, because the latch 50 does not wait to look at the evaluation value of the D1-domino 48 to transition LOW. In this case, the speculative turn-OFF edge for the select signal is the correct guess by the slave latch 50. Even if the D1-domino evaluates to LOW during its evaluation phase, the slave latch 50 speculatively starts to transition LOW because when the slave clock signal rises, the D1-domino output is still HIGH and therefore the slave latch 50 begins to transition LOW. In this case, the speculative turn-off by the slave latch 50 is a wrong guess. However at some point though, the D1-domino 48 transitions low enough to be able to pull-up the slave latch 50 and correct it. This creates a glitch on the slave latch's output, i.e., the slave latch 50 begins to transition low but then it pulled back up.

Referring to FIG. 2, the LVS select signals on line 64, prior to passing through the inverters 46, are referred to as LVS select signals "x". Referring back to FIG. 6, the turning-OFF edge of a given select signal x is shown by part of its waveform 106. As shown by an arrow 108, this turning-OFF edge is de-asserted one inversion after the rise of the domino/slave clock signals. The turning-ON edge of the select signal x is shown by part of its waveform 110. As shown by an arrow 112, this turning-ON edge is asserted two inversions after the rise of the domino/slave clock signals.

Setting the clock delay of the delay buffer 55 between the D1-domino 48 and slave latch 50 to zero is likely to yield the slowest turning-OFF edge arrival time of the select signal at the gates of the LVS circuit 20. Even in this first application, the select logic circuit 22 is able to provide a turning-OFF edge at the gates of the LVS circuit 20 that matches the delay of the current state of the art illustrated in FIG. 1. This is achieved while providing an extra buffering inverter 52 between the slave latch 50 and the LVS circuit 20 for better noise rejection and drive capability. As mentioned above, this advantage of the select logic circuit 22 may be obtained with the domino and slave clocks being the same common clock signal or with the master, domino, and slave clock signals being the same common clock signal.

Figure 7:
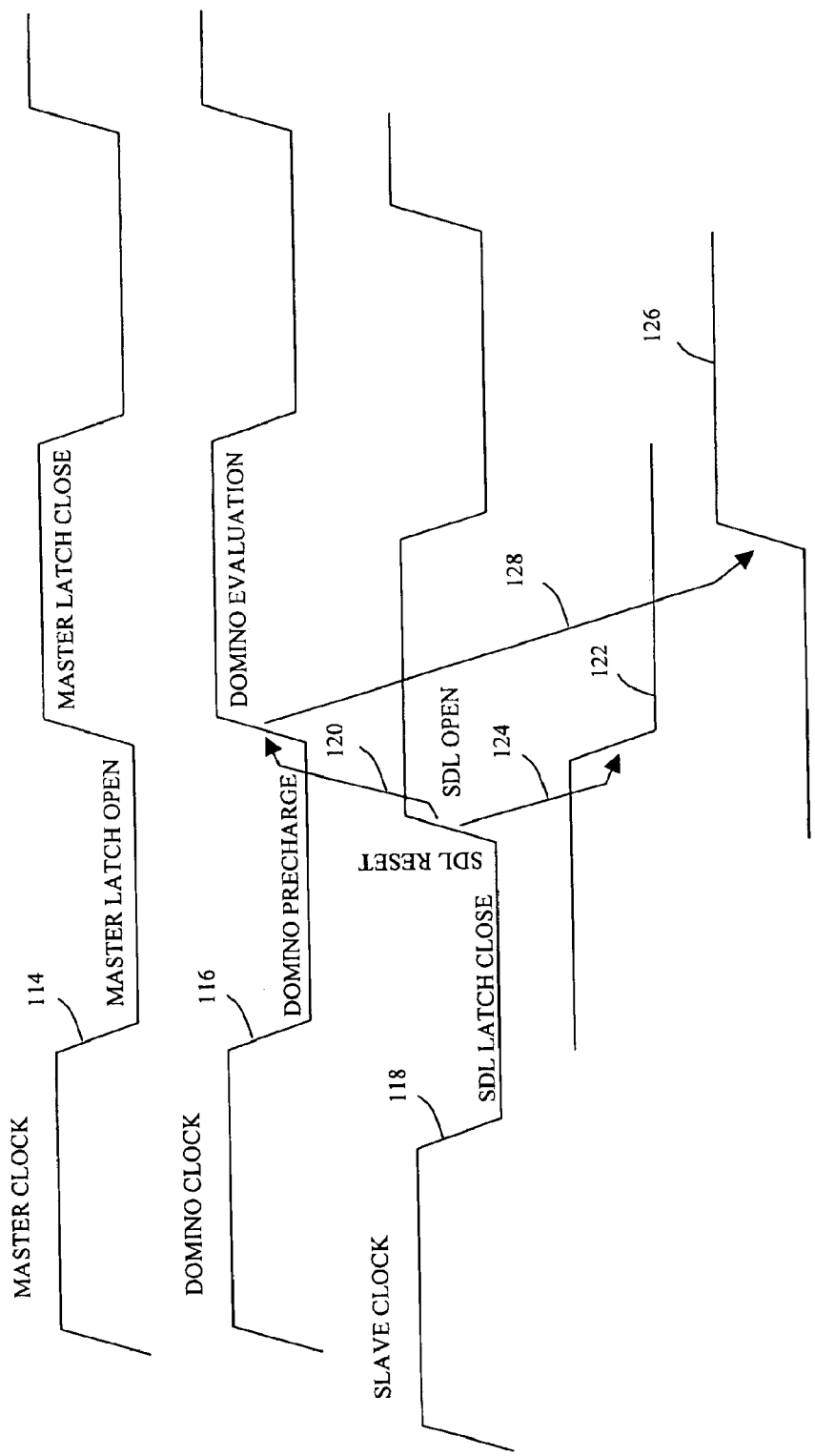
FIG. 7 is a timing diagram of a first application of the select logic circuit of FIG. 2 wherein the domino clock signal has a delay relative to the slave clock signal.
Figure 8:
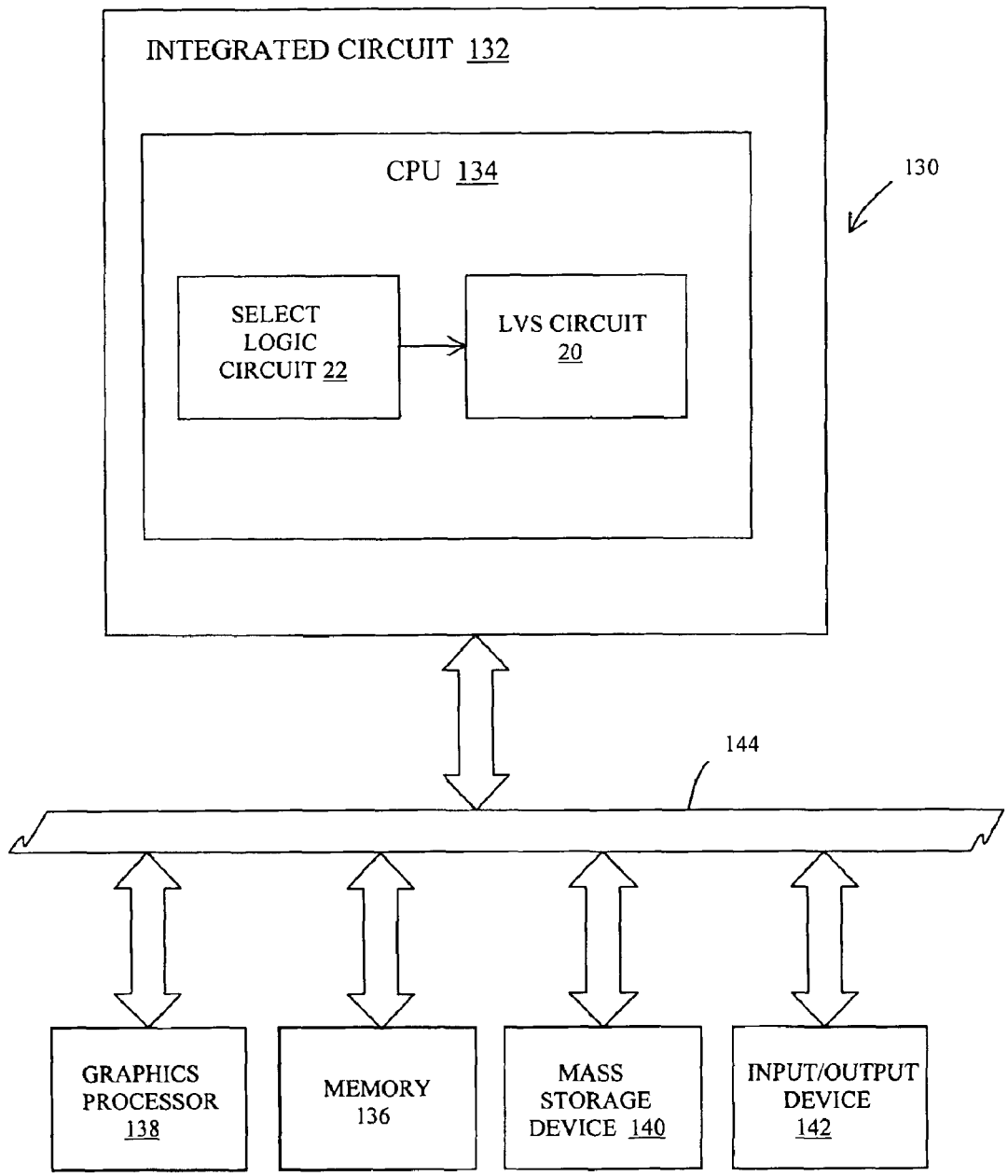
FIG. 8 is a block diagram of a system including an integrated circuit having the select logic circuit and the LVS circuit shown in FIG. 2, in accordance with one embodiment.

Referring to FIGS. 2 and 7, the second application of the select logic circuit 22 is described in detail. The master, domino and slave clock signals are shown by waveforms 114, 116, and 118 respectively. In this second application, a delay is introduced between the domino clock signal 116 and slave clock signal 118. In this illustrative example, relative to FIG. 6, the domino clock signal 116 of FIG. 7 remains the same, but the slave clock signal 118 is adjusted to be 2 inversions earlier. This is accomplished by the domino clock signal 116 being derived by buffering the slave clock signal 118 with two inverters in the delay buffer 55. As in FIG. 6, the master clock signal 114 and the domino clock signal 116 of FIG. 7 are fixed, but the slave clock signal 118 is variable. The CLOCK2 (slave clock) is sped up, but the domino clock remains unchanged due to the delay of the buffer 55. More specifically, the clock generator 53 generates the slave clock signal with a clock advance relative to the master clock. The clock delay of the delay buffer 55 effectively cancels the clock advance so that the domino clock is not sped up relative to the master clock, but the slave clock is sped up. This allows for speeding up the slave latch 50 without worsening the time constraints on the FF-INPUTS and without compromising the turn-ON edge. Also as in FIG. 6, the phases/stages of the master latches 46, D1-dominos 48, and slave latches 50 are shown in FIG. 7, but will not be described again.

In operation, at the moment the slave clock signal 118 rises, the domino clock signal 116 is still LOW as shown by an arrow 120. Therefore, the D1-domino 48 is still in its precharge phase. The output of the slave latch 50 (select signal x) on the line 64 begins to transition LOW regardless of the data value on a line 66 from the D1-domino 48, because the domino output on a line 68 remains at its pre-charge phase value. The LVS select signal x is de-asserts its turning-OFF edge one inversion before the rise of the domino clock signal 116. This is illustrated by the turning-OFF edge of the select signal x shown by a segment of its waveform 122 and an arrow 124 between the rising slave clock signal 118 ant the turning-OFF edge of the LVS select signal waveform segment 122. The turning-ON edge of the select signal x is illustrated by its waveform segment 126. As shown by an arrow 128, the LVS select signal x asserts its turning-ON edge two inversions after the rise of the domino clock signal 116. In comparison with FIG. 6, this turning-ON edge in FIG. 7 remains unchanged. On the other hand, the turning-OFF edge of FIG. 7 is advanced in time (2 inversion speedup) relative to the turning-OFF edge of FIG. 6.

The select signal x on line 64 is matched in polarity with the final LVS select signal because there is an even number of buffering inverters 52 between the slave latch 50 and the LVS circuit 20. Hence, the data independent HIGH to LOW transition of the slave latch 50 enables the FALL transition of the turning-OFF edge of the LVS select signal to occur earlier than their occurrences in the prior art design described in FIG. 1.

In summary, the select logic circuit 22 enables the turning-OFF edge to be generated independently of the input data. Instead, the slave clock signal resetting the slave latch 50 triggers the turning-OFF edge. As described above, using the clock signal for triggering the turning-OFF edge is speculative—it may or may not be correct. In other words, with the select logic circuit 22, the turning-OFF edge is generated without waiting for the data and thereafter the output of the slave latch 50 may or may not be turned on depending upon the data. Referring to FIG. 2, by speeding up the second clock signal CLOCK2 relative to the first clock signal CLOCK1 and adjusting the second clock (CLOCK2) that resets the slave latch 50 relative to the timing of the domino clock by adjusting the delay buffer 55, it is possible to significantly speed-up the turning-OFF edge of the previously ON select signal without further constraining the data inputs.

There are several advantages of the embodiment of the select logic circuit 22, as will be described with respect to FIGS. 1 and 2. First, the select logic circuit allows for a faster target frequency because it may produce a faster select turning-OFF edge. Second, the select logic circuit 22 may speed up the delivery of the select turning-OFF edge without placing additional constraints on the inputs to the master latch 26. To the contrary, in the prior art design of FIG. 1, if the clock to the flip-flop 12 is sped up by n amount of seconds then the constraints on the flip-flop will also get more stringent by n pS. Third, the select logic circuit 22 enables the use of more buffering inverters 52 between the master latch 46 and the LVS circuit 20. Since the turning-OFF edge can be sped-up significantly by the select logic circuit 22, more buffer stages may be used to drive the select signal to the LVS circuit 20. The prior art design of FIG. 1 relies on minimizing the number of buffer stages between the driver and receiver to speedup the turning OFF edge of the select signals and therefore compromises the ability of the select branch to reject noise that can enter the LVS circuit 12. The robustness, and especially speed, of LVS circuits is very sensitive to noise on its controls (gates) and therefore the select logic circuit 22 allows for a faster and more robust LVS circuit. Fourth, the select logic circuit 22 does not rely on skewing of the buffering inverters 52 as occurs in FIG. 1 and therefore it is a more robust solution (better edge-rate, better noise rejection).

There are two aspects to the second advantage described above. First, the select logic circuit 22 permits the speeding up of the select signal's turning-OFF edge without requiring that the FF-INPUT signal (see FIG. 2) come earlier. This is another reason to keep the master clock signal fixed for all cases, e.g., the two cases illustrated in FIGS. 6 and 7. In fact, the master clock signal remains the same for both the prior art select logic circuit 10 of FIG. 1 and the select logic circuit 22 of FIG. 2. Second, the select logic circuit 22 avoids jeopardizing the timing of turning-ON edge of the select signals when the turning-OFF edge of the select circuit is sped up. With the master clock signal already fixed, it is desirable to keep the domino clock signal fixed between the first and second application of the select circuit 22 because moving this clock signal can violate the two aspects described above. Therefore, preferably the only clock with variable timing is the slave clock signal.

With respect to FIG. 7, it is not possible to keep "pulling in" the slave clock signal (shifting it to the left). The amount that the slave clock signal can be "pulled in" (i.e., delayed) is determined by the time it takes to pre-charge the D1-domino 48 after the domino clock signal falls.

Referring to FIG. 5, there is illustrated one of many possible systems 130 in which the select logic circuit 22 and LVS circuit 20 may be used. The two circuits 20 and 22 are shown implemented in an integrated circuit (IC) 132. In one embodiment, the IC 132 is a microprocessor. In an alternate embodiment, the IC 132 may be an application specific IC (ASIC). The circuits 20 and 22 are included in a central processing unit 134 of the IC 132 and, more specifically, in an arithmetic and logic unit (ALU) and address generation unit (AGU). The LVS circuit 20, with the select logic circuit 22, is used as a front-end LVS multiplexer for the ALU and the AGU to substantially guarantee that the distributed static LVS selects do not create reverse differential build-up at the onset of LVS evaluation, especially for very fast target frequencies (7+ GHz integer executions).

For the embodiment, the system 130 also includes a main memory 136, a graphics processor 138, a mass storage device 140 and an input/output module 142 coupled to each other by way of a bus 144, as shown. Examples of the memory 146 include but are not limited to static random access memory (SRAM) and dynamic random access memory (DRAM). Examples of the mass storage device 140 include but are not limited to a hard disk drive, a compact disk drive (CD), a digital versatile disk driver (DVD), and so forth. Examples of the input/output modules 142 include but are not limited to a keyboard, cursor control devices, a display, a network interface, and so forth. Examples of the bus 144 include but are not limited to a peripheral control interface (PCI) bus, and Industry Standard Architecture (ISA) bus, and so forth. In various embodiments, system 140 may be a wireless mobile phone, a personal digital assistant, a pocket PC, a tablet PC, a notebook PC, a desktop computer, a set-top box, an entertainment unit, a DVD player, and a server.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
  a low voltage swing (LVS) circuit having a plurality of alternating LVS pre-charging and evaluation phases;
  a clock generator for generating at least one clock signal; and
  a select logic circuit coupled to the LVS circuit and the clock generator and responsive to the clock signal and a plurality of input data signals to generate a plurality of select signals for the LVS circuit, each of the select signals occurring during one of the LVS evaluation phases and having a turning-on edge triggered by one of the input data signals and a turning-off edge triggered by the clock signal independently of the input data signals.

2. The apparatus according to claim 1, wherein the clock generator is operable to generate a master clock signal, a domino clock signal and a slave clock signal; and wherein the select logic circuit further includes at least one master latch coupled to the clock generator and responsive to one of the input data signals and the master clock signal to generate a latch output signal; at least one D1-domino coupled to the clock generator and the master latch to generate a domino output signal in response to the latch output signal and the domino clock signal; and at least one slave latch coupled to the clock generator and the D1-domino to generate one of the select signals in response to the domino output signal and the slave clock signal.

3. The apparatus according to claim 2, wherein the slave latch is a set dominant latch and the turning-off edge is triggered in response to the slave clock signal.

4. The apparatus according to claim 3, wherein the D1-domino and the slave latch are disposed in an in-phase relationship and the master latch and slave latch are disposed in an out-of-phase relationship.

5. The apparatus according to claim 4, wherein the select logic circuit further comprises at least one pair of buffering inverters coupled between the slave latch and the LVS circuit.

6. The apparatus according to claim 2, wherein the slave clock signal and the domino clock signal are the same and wherein the turning-off edge of each of the select signals has a one-gate delay through the slave latch and the turning-on edge of each of the select signals has a two gate delay through the D1-domino and the slave latch.

7. The apparatus according to claim 2, wherein the clock generator is operable to speed up the slave clock signal relative to the master clock signal and the master clock signal and the domino clock signal are the same.

8. The apparatus according to claim 2, wherein the clock generator includes a clock source to generate the master clock and the slave clock signal with a clock advance relative to the master clock and further includes a delay buffer coupled to the clock source and a gate of the D1-domino to provide the domino clock signal in response to the slave clock signal, with the delay buffer having a clock delay to substantially cancel the clock advance.

9. The apparatus according to claim 2, wherein the LVS circuit has a plurality of input terminals; and the select logic circuit includes a plurality of master latches with each master latch coupled to the clock generator and capable of receiving one of the input data signals; a plurality of D1-dominos with each of the D1-dominos coupled to one of the master latches and the clock generator; and a plurality of slave latches with each of the slave latches coupled to one of the D1-dominos and the clock generator.

10. The apparatus according to claim 2, wherein the select logic circuit further includes a plurality of pairs of the buffering inverters with each of the pairs being coupled between one of the slave latches and to one of the input terminals of the LVS circuit.

11. The apparatus according to claim 2, wherein the D1-domino has a plurality of alternating domino pre-charging and evaluation phases; the D1-domino is capable of generating the domino output signal during one of the domino evaluation phases; and the slave latch is capable of generating the select signal during one of the LVS evaluation phases.

12. An apparatus, comprising:
a low voltage swing (LVS) circuit;
a clock generator to generate a master, a domino, and a slave clock signal;
a select logic circuit further including a plurality of master latches with each of the master latches being coupled to the clock generator and responsive to one of a plurality of input data signals and the master clock signal to generate one of a plurality of latch output signals; a plurality of D1-dominos with each of the D1-dominos being coupled to the clock generator and one of the master latches to generate one of a plurality of domino output signals in response to one of the latch output signals and the domino clock signal; and a plurality of slave latches with each of the slave latches being coupled to the clock generator and one of the D1-dominos to generate one of a plurality of select signals for the LVS circuit in response to the one of the domino output signals and the slave clock signal.

13. The apparatus according to claim 12, wherein the D1-dominos and the slave latches are disposed in an in-phase relationship and the master latches and slave latches are disposed in an out-of-phase relationship.

14. The apparatus according to claim 13, wherein each of the slave latches is a set dominant latch and a turning-off edge of each of the select signals is triggered in response to the slave clock signal and a turning-on edge of each of the select signals is triggered in response to one of the input data signals.

15. The apparatus according to claim 12, wherein the clock generator is operable to speed up the slave clock signal relative to the master clock signal and the master clock signal and the domino clock signal are the same.

16. The apparatus according to claim 12, wherein the clock generator includes a clock source to generate the master clock and the slave clock signal with a clock advance relative to the master clock and further includes a delay buffer coupled to the clock source and the D1-dominos to provide the domino clock signal in response to the slave clock signal, with the delay buffer having a clock delay to substantially cancel the clock advance.

17. The apparatus according to claim 12, wherein the LVS circuit has a plurality of input terminals, the select logic circuit further comprises a plurality of pairs of buffering inverters, with each of the pairs of buffer inverters being coupled between one of the slave latches and one of the input terminals of the LVS circuit.

18. The apparatus according to claim 12, wherein the second and domino clock signals are the same and wherein the turning-off edge of each of the select signals has a one-gate delay through one of the slave latches and the turning-on edge of each of the select signals has a two gate delay through one of the D1-dominos and one of the slave latches.

19. A system, comprising:
an integrated circuit including
a low voltage swing (LVS) circuit having a plurality of alternating LVS pre-charging and evaluation phases;
a clock generator for generating at least one clock signal; and
a select logic circuit coupled to the LVS circuit and the clock generator and responsive to the clock signal and a plurality of input data signals to generate a plurality of select signals for the LVS circuit, each of the select signals occurring during one of the LVS evaluation phases and having a turning-on edge triggered by one of the input data signals and a turning-off edge being triggered by the clock signal;

a dynamic random access memory coupled to the integrated circuit; and an input/output interface coupled to the integrated circuit.

20. The system according to claim 19, the LVS circuit comprises a multiplexer LVS circuit.

21. The system according to claim 20, the integrated circuit further comprises a central processor unit including the multiplexer LVS and the select logic circuit.

22. The system according to claim 21, wherein the integrated circuit is a microprocessor.

23. The system according to claim 22, wherein the input/output interface comprises a networking interface.

24. The system according to claim 23, wherein the system is a selected one of a set-top box, an entertainment unit and a DVD player.

25. A method of generating a plurality of select signals for a low voltage swing (LVS) circuit having a plurality of alternating LVS pre-charging and evaluation phases, comprising:

generating a plurality of select signals in response to a plurality of input data signals, each of the select signals occurring during one of the LVS evaluation phases and having a turning-on edge and a turning-off edge; and adjusting the turning-off edge of each of the select signals independently of the input data signals to increase a difference between an arrival time at the LVS circuit of the turning-off edge of each of the select signals and an arrival time at the LVS circuit of the turning-on time of a next one of the select signals.

26. The method according to claim 25, further comprising generating at least one clock signal and wherein the adjusting the turning-off edge includes triggering the turning-off edge based upon the clock signal.

27. The method according to claim 26, wherein adjusting the turning-off edge of each of the select signals includes providing a two gate delay first through a D1-domino and then through a slave latch for the turning-on edge of the select signal and providing a one gate delay through the slave latch for the turning-off edge of the select signal.

28. The method according to claim 27, wherein generating at least one clock signal includes generating a domino clock signal for the D1-domino and a slave clock signal for the slave latch and wherein adjusting the turning-off edge of each of the select signals further includes speeding up the turning-off edge of the select signal by advancing the slave clock signal relative to domino clock signal and triggering the turning-off edge based upon the slave clock signal.

29. The method according to claim 28, wherein adjusting the turning-off edge of each of the select signals includes passing the input data signals first through a master latch and then through the D1-domino and the slave latch; and operating the master latch and slave latch out-of-phase and the D1-domino and slave latch in-phase.

30. The method according to claim 29, wherein generating a plurality of select signals includes buffering the select signals prior to arriving at the LVS circuit by at least a pair of buffering inverters.

* * * * *

UNITED STATES PATENT AND TRADEMARK OFFICE
CERTIFICATE OF CORRECTION

PATENT NO. : 6,922,082 B2
APPLICATION NO. : 10/676345
DATED : July 26, 2005
INVENTOR(S) : Wijeratne It is certified that error appears in the above-identified patent and that said Letters Patent is hereby corrected as shown below:

In the Drawings:
Fig. 1, "LVS MUX 10" should read --LVS CIRCUIT 10--;
Fig. 2, "LVS MUX 20" should read --LVS CIRCUIT 20--;
Fig. 2, "BUFFERS" should read --BUFFERING INVERTERS--;
Fig. 3, "n1" should read --N1--;
Fig. 3, "n2" should read --N2--;
Fig. 3, "n3" should read --N3--;
Fig. 3, "p1" should read --P1--;
Fig. 3, "p2" should read --P2--;
Fig. 3, "INPUT/OUTPUT DEVICE 142" should read --INPUT/OUTPUT MODULE 142--;

In the Claims:
Col. 3, line 35, "...signals LCS-IN1, LCS-IN2, and LCS-IN3 respectively..." should read --...signals LVS-IN1, LVS-IN2, and LVS-IN3 respectively...--;
Col. 6, line 51, "...signal 90 provides..." should read --...signal 94 provides...--;
Col. 8, line 4, "...the inverters 46, are..." should read --... the buffering inverters 52, are...--;
Col. 9, line 52, "...the LVS circuit 12." should read --...the LVS circuit 10.--;
Col. 9, line 67, "...art select logic circuit 10..." should read --...art LVS circuit 10...--;
Col. 10, line 34, "...memory 146 include..." should read --...memory 136 include...--; and
Col. 13, line 7, "...a central processor unit..." should read --...a central processing unit...--.

Signed and Sealed this

Fifth Day of February, 2008

JON W. DUDAS
*Director of the United States Patent and Trademark Office*